US009130622B2

(12) United States Patent
Montalvo (10) Patent No.: US 9,130,622 B2
(45) Date of Patent: Sep. 8, 2015

(54) APPARATUS AND METHOD FOR LOW VOLTAGE RADIO TRANSMISSION (75) Inventor: Antonio Montalvo, Raleigh, NC (US)

(73) Assignee: ANALOG DEVICES, INC., Norwood, MA (US)

( * ) Notice: Subject to any disclaimer, the term of this patent is extended or adjusted under 35 U.S.C. 154(b) by 1058 days.

(21) Appl. No.: 12/848,779

(22) Filed: Aug. 2, 2010

(65) Prior Publication Data
US 2012/0028591 A1 Feb. 2, 2012

(51) Int. Cl.
*H04B 1/04* (2006.01)
(52) U.S. Cl.
CPC ..................................... *H04B 1/0475* (2013.01)
USPC .................. 455/114.3; 455/114.1; 455/114.2; 455/115.1; 375/296; 375/298
(58) Field of Classification Search
CPC ............ H04B 1/0475; H04B 2001/04; H04B 2001/02; H04B 1/00; H04B 1/62
See application file for complete search history.

(56) References Cited

U.S. PATENT DOCUMENTS

| | | | |
|---|---|---|---|
| 6,594,499 B1 * | 7/2003 | Andersson et al. ............ 455/522 |
| 6,879,641 B2 * | 4/2005 | Unger ........................... 375/296 |
| 7,437,173 B2 * | 10/2008 | Lee et al. ....................... 455/522 |
| 7,973,698 B1 * | 7/2011 | Woodell et al. ............. 342/26 B |
| 8,150,351 B2 * | 4/2012 | Shah et al. .................. 455/226.1 |
| 2004/0057533 A1 * | 3/2004 | Kermalli ........................ 375/296 |
| 2004/0092233 A1 * | 5/2004 | Rudrapatna ...................... 455/69 |
| 2005/0118980 A1 * | 6/2005 | Pai et al. ........................ 455/340 |
| 2006/0194557 A1 * | 8/2006 | Cowley et al. ................. 455/313 |
| 2008/0100374 A1 * | 5/2008 | Papananos et al. ........... 327/553 |
| 2008/0311864 A1 * | 12/2008 | Wallis ......................... 455/115.1 |
| 2010/0130152 A1 * | 5/2010 | Whikehart et al. ......... 455/226.2 |

FOREIGN PATENT DOCUMENTS

WO    WO 2010030212 A1 *   3/2010

OTHER PUBLICATIONS

Mirzaei et al., "A Low-Power WCDMA Transmitter with an Integrated Notch Filter," IEEE Journal of solid-State Circuits, Dec. 2008, pp. 2868-2881, vol. 43(12).
Montalvo et al., "A Wireless Transceiver with Integrated Data Converters for 802.11a/b/g Access Points," 2006 IEEE International Solid-State Circuits Conference, Feb. 7, 2006, 10 pages.

* cited by examiner

*Primary Examiner* — Edward Urban
*Assistant Examiner* — Mohammed Rachedine
(74) *Attorney, Agent, or Firm* — Knobbe, Martens, Olson & Bear LLP (57) ABSTRACT

Apparatus and methods are disclosed related to low-voltage radio transmitters with high spectral purity. One such apparatus includes a baseband path with a predistortion stage, a programmable filter, and an upconverter core. In an embodiment, the programmable filter is placed between the predistortion stage and the upconverter core. In an embodiment, the programmable filter is configured by a controller to reject out-of-band noise introduced at the predistortion stage or earlier.

25 Claims, 6 Drawing Sheets

FIG. 6B

APPARATUS AND METHOD FOR LOW VOLTAGE RADIO TRANSMISSION

BACKGROUND

1. Field

Embodiments of the invention relate to electronic systems, and more particularly, to radio frequency (RF) transmitters in electronic systems.

2. Description of the Related Technology

Certain electronic systems employ a wireless transmitter, for example, a radio frequency transmitter. One challenge of designing high-performance radio transmitters is achieving spectral purity with minimum noise or distortion. Ideally, a radio frequency transmitter produces a desired signal and no noise or distortion.

In practice, however, transmitters also produce and transmit noise and spurious signals in addition to the desired signal. The transmitted noise can degrade either network or device performance in a variety of ways. For example, in a frequency division duplex (FDD) system, transmitter noise that falls on a receive channel can desensitize a receiver. Furthermore, in any system, transmitter noise can fall in the receive channel of other devices and interfere with their performance. Under some frequency licensing schemes (for example, under rules such as 37 C.F.R. §90.18), there may be strict limits regarding how much out-of-band noise may be transmitted. Conversely, in-band noise restrictions may be relatively lenient. Therefore, there is a need for providing a wireless transmitter with a scheme to minimize undesired noise.

Overview of Radio Frequency Transmitter

Figure 1:
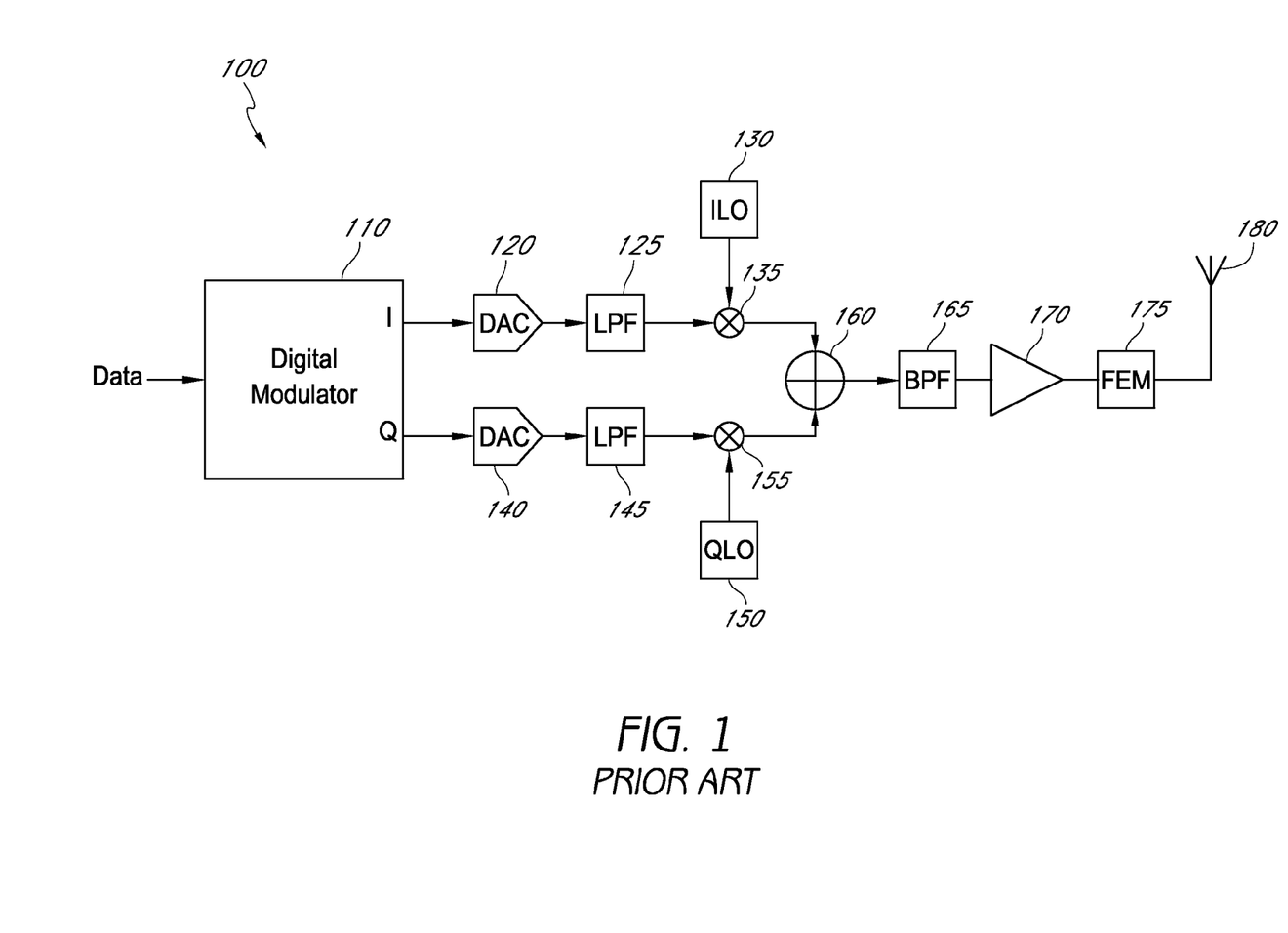
FIG. 1 is a schematic block diagram of a conventional radio transmitter.

FIG. 1 is a block diagram illustrating a conventional linear radio frequency transmitter 100. The illustrated transmitter 100 includes a transmission path which includes a digital modulator 110 which has in-phase (I) and quadrature (Q) outputs, first and second digital-to-analog converters (DACs) 120, 140, first and second low pass filters 125, 145, first and second mixers 135, 155, first and second local oscillators 130, 150, a summing unit 160, a band-pass filter (BPF) 165, an amplifier 170, and a front-end module (FEM) 175.

The digital modulator 110 serves to convert a data input into a digital symbol using a mapping such as N-QAM, for example.

The first DAC 120 serves to receive the in-phase component of the modulated signal, and converts it into a first analog signal. The second DAC 140 serves to receive the quadrature-phase component of the modulated signal, and converts it into a second analog signal.

The first low-pass filter 125 serves to select a desired frequency range and block undesired frequencies in the first analog signal along the in-phase path. The first low-pass filter 125 generates a first filtered analog signal. The first low-pass filter 125 can act as a reconstruction filter to remove images introduced by the first DAC 120. The second low-pass filter 145 serves to select a desired frequency range and block undesired frequencies in the second analog signal along the quadrature-phase path. The second low-pass filter 145 generates a second filtered analog signal. Similarly to the first low-pass filter 125, the second low-pass filter 145 can act as a reconstruction filter to remove images introduced by the second DAC 140.

The first local oscillator (ILO) 130 is an in-phase local oscillator that serves to generate an in-phase RF carrier frequency for modulation by the first filtered analog signal. The second local oscillator (QLO) 150 is a quadrature-phase local oscillator that serves to generate a quadrature-phase RF carrier frequency for modulation by the second filtered analog signal. The ILO 130 and the QLO 150 can be implemented as a single unit that outputs two local frequency signals with a phase difference of about 90 degrees from each other.

The first mixer 135 serves to modulate the in-phase RF carrier frequency, generated by the ILO 130, by the first filtered analog signal received from the LPF 125. The first mixer 135 generates a first mixed signal. The second mixer 155 serves to modulate the quadrature-phase RF carrier frequency, generated by the QLO 150, by the second filtered analog signal received from the LPF 145. The second mixer 155 generates a second mixed signal.

The summing unit 160 combines the first mixed signal received from the first mixer 135 with the second mixed signal received from the second mixer 155. The summing unit 160 can combine the first and second mixed signals by summing their signals, thereby combining the in-phase and quadrature-phase components into a combined signal.

The band-pass filter (BPF) 165 serves to allow a selected frequency range to pass while rejecting frequencies above and below a desired range. The BPF 165 filters the combined signal received from the summing unit 160 and generates a combined filtered signal.

The amplifier 170 serves to increase the power of the combined filtered signal. The amplifier 170 amplifies the combined filtered signal received from the BPF 165 and generates an amplified, combined, and filtered signal.

The front-end module (FEM) 175 serves to prepare the amplified, combined, and filtered signal for transmission at the antenna 180. The FEM 175 can include a duplex filter or a transmit/receive switch.

The antenna 180 is configured to transmit a wireless signal via a wireless medium, such as air. The antenna 180 transmits the modulated RF signal received from the FEM 175. The antenna 180 can be any suitable antenna for wireless signal reception and transmission.

As semiconductor processing technology evolves, transmitters are being designed under smaller-scale processes because deep-submicron (for example, 65 nm) CMOS technology provides a number of advantages for RF circuits. For example, a relatively high transition frequency ($f_T$) reduces internal node capacitances and enables inductor-less topologies. Furthermore, much faster switching reduces the noise contribution of large signal circuits, such as local oscillator (LO) dividers and buffers. However, these advantages are typically accompanied by challenges, such as lower supply voltage (for example, 1.2 V) and lower intrinsic transistor gain ($g_m * r_o$). As the supply voltage decreases, the traditional design challenges reverse. The relatively fast switching of deep-submicron transistors allows the LO path to contribute less noise and to operate with acceptable power efficiency. On the other hand, it has become more of a challenge to have relatively good noise characteristics in the baseband signal path under a low-voltage supply.

Traditionally, the transmitter 100 operated at a relatively high supply voltage, for example, about +2.7 V. Because the phase noise of local oscillator (LO) paths (for example, the paths starting at the ILO 130 and the QLO 150) can be much higher for a given power efficiency in slower technologies, significant efforts are dedicated to mitigate the noise introduced by upconverters, such as the mixers 135, 155. In contrast, the baseband signal path (for example, the path starting at the data input 105 and ending at the mixers 135, 155) was often a relatively easy part of traditional transmitter design because large signal swings allowed a high signal-to-noise ratio (SNR) with reasonable power dissipation.

As an example, typical amplifier topologies can support a maximum peak-to-peak signal swing of Vdd–3*Vdsat. Typically, the saturation voltage Vdsat is on the order of 200 mV. Comparing the peak baseband signal swing achievable with a 2.7 V supply to that with a 1.2 V supply, the 1.2 V implementation can tolerate 3.5 times less signal swing. Since the thermal noise current of a transistor is proportional to the square-root of the drain current, 3.5 times less signal swing translates to more than 12 times higher current for a given SNR. Such a current is unacceptable for many applications, and design constraints may prevent relaxation of the signal-to-noise ratio.

In addition to the large signal swing that older technologies with higher power supplies made possible, circuit techniques for making linear transconductors can alternatively be used. For example, resistive degeneration can be used to linearize the voltage-to-current transfer function of a MOSFET or bipolar transistor. In the case of a MOSFET, the voltage drop across the degeneration resistor is typically large compared to Vdsat in order for the degeneration to be effective. With the 1.2 V power supply of, for example, a 65 nm CMOS process, resistor degeneration is not practical.

Figure 2:
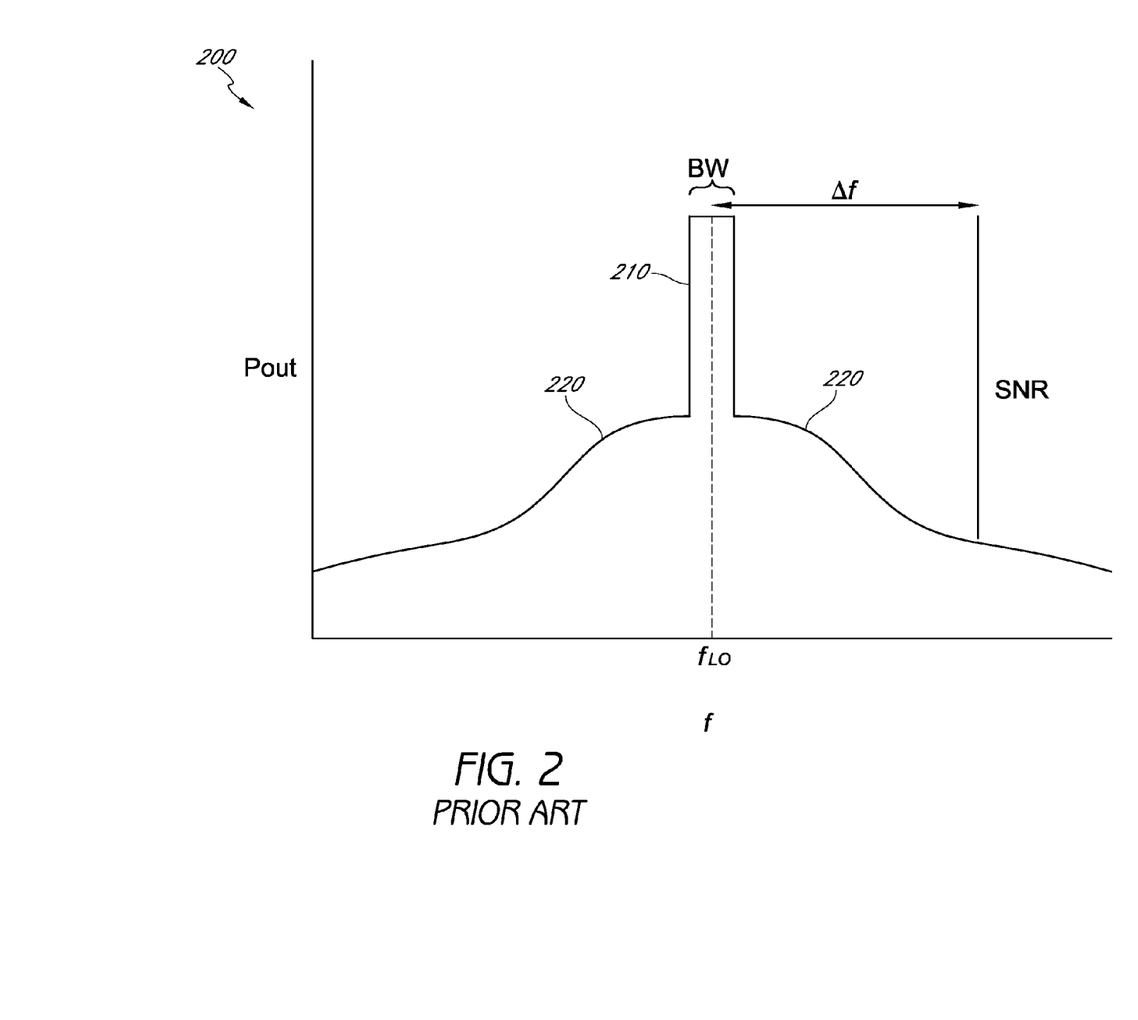
FIG. 2 is a graph showing a signal-to-noise ratio in radio frequency transmission according to one embodiment.

FIG. 2 is a graph 200 depicting the frequency response of a transmitter, such as the transmitter 100 shown in FIG. 1. The graph 200 shows the power output by the transmitter (Pout) along the vertical axis at various frequencies (f) along the horizontal axis. As shown in the graph 200, there is a power output peak 210 of width BW, centered around the frequency of the local oscillator ($f_{LO}$). BW is the target bandwidth for a given application. Ideally, there is no transmission outside of this band. In practice, however, a transmitter will typically transmit some out-of-band noise 220, which falls off at frequencies above and below $f_{LO}$. The SNR at frequency offset Δf is defined by the height of the peak 210 divided by the noise at Δf offset from $f_{LO}$.

SUMMARY

One embodiment includes an apparatus, wherein the apparatus includes: an upconverter; an analog predistorter configured to receive an input signal and to generate a predistorted signal that at least partially corrects non-linearity of the upconverter; and a filter disposed in a signal path between the predistorter and the upconverter, wherein the filter is configured to filter the predistorted signal to generate a filtered predistorted signal, wherein the filtered predistorted signal is provided as an input to the upconverter, wherein the filter is configured to reduce out-of-band noise generated by the predistorter.

One embodiment includes a method of processing a signal, wherein the method includes: predistorting an analog signal to generate a predistorted signal, wherein the predistorted signal at least partially compensates for non-linearity of a transistor; filtering the predistorted signal to generate a filtered signal; and upconverting the filtered signal, wherein the transistor to be compensated is used in upconverting.

One embodiment includes an apparatus for processing a signal, wherein the apparatus includes: means for predistorting a signal to generate a predistorted signal, wherein the predistorted signal at least partially compensates for non-linearity of a transistor; means for filtering the predistorted signal to generate a filtered signal; and means for upconverting the filtered signal, wherein the upconverting means comprises the transistor to be compensated.

DETAILED DESCRIPTION OF EMBODIMENTS

The following detailed description of certain embodiments presents various descriptions of specific embodiments of the invention. However, the invention can be embodied in a multitude of different ways as defined and covered by the claims. In this description, reference is made to the drawings where like reference numerals indicate identical or functionally similar elements.

Predistortion Stage and Upconverter with Improved Noise Performance

As discussed above, one challenge of designing a transmitter having a relatively low supply voltage includes minimizing noise in the baseband signal path. In transmitters that include an analog predistortion stage, additional noise may be introduced by the predistortion stage, which may be mirrored and amplified in a later stage, such as a mixer, upconverter, and/or amplifier. Therefore, it can be desirable to mitigate noise introduced in the predistortion stage ("predistortion noise") before amplification compounds the problem.

In one embodiment, a filter is introduced between a predistortion stage and the upconverter. The filter can be programmable or nonprogrammable. By filtering predistortion noise (thermal noise of an amplifier in the predistortion stage) between the predistortion stage and the upconverter, noise performance is improved. Furthermore, the upconverter can operate at a higher amplification ratio. This higher amplification ratio can therefore allow the predistortion stage to operate at a lower power than without the filter. Thus, overall power efficiency may be improved.

Figure 3:
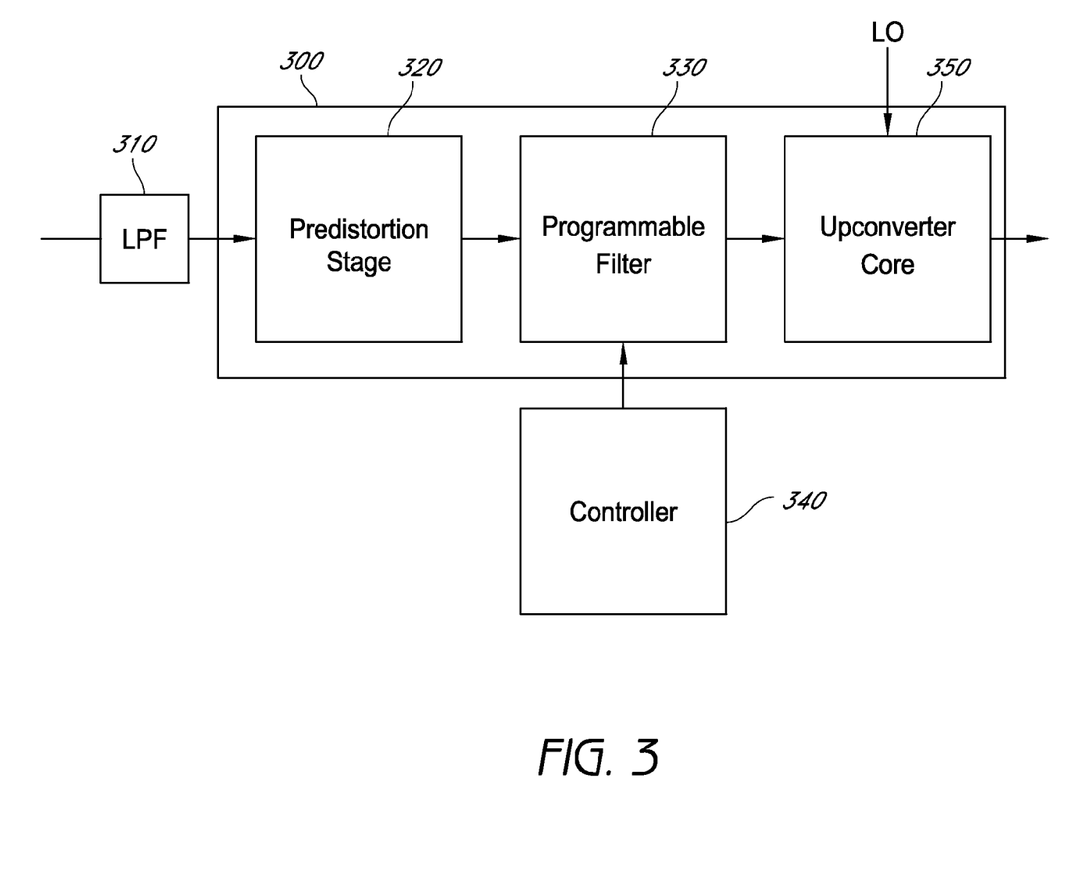
FIG. 3 is a schematic block diagram of a portion of the transmission path of a radio frequency transmitter according to one embodiment.

FIG. 3 is a block diagram of a portion 300 of a baseband path according to one embodiment. The portion 300 of FIG. 3 can be implemented with the portion 400 of FIG. 4, as will be described below. The illustrated portion 300 of the baseband path can be part of a radio frequency transmitter, such as the transmitter 100, shown in FIG. 1. For example, with respect to FIG. 1, the portion 300 of the baseband path can be used as at least part of the first mixer 135 and/or the second mixer 155.

In some embodiments, a transmitter including a baseband path does not have a separate amplification stage, such as the amplifier 170, as shown in FIG. 1. In general, a skilled artisan will appreciate that the portion 300 of the baseband path can be used in a number of different transmitter configurations, which need not include all components shown in FIG. 1, and can include additional components not shown.

Referring again to FIG. 3, the illustrated portion 300 of the baseband path includes a predistortion stage 320, a programmable filter 330, an upconverter core 350, and a controller 340. The portion 300 can receive a signal from a low pass filter (LPF) 310.

The LPF 310 is configured to receive an input analog signal. The input signal to the LPF 310 can come from a digital-to-analog converter (DAC), such as the DACs 120, 140 as shown in FIG. 1. The functions of the LPF 310 can be as described above in connection with those of the LPFs 125, 145 of FIG. 1. Specifically, the LPF 310 can select a desired frequency range and block undesired frequencies. Typical frequency ranges are between 100 kHz and 25 MHz though many other frequency ranges are possible.

In some embodiments, the LPF 310 can act as a reconstruction filter to remove images introduced by an earlier component. In other embodiments, the LPF 310 can be omitted. The LPF 310 can be omitted, for example, in transmitter topologies where the input to the portion 300 of the baseband path is already filtered or where a DAC does not precede the input. The output from the LPF 310 then passes into a predistortion stage 320.

The predistortion stage 320 can adjust the signal from the LPF 310 in order to mitigate non-linearity of the upconverter core 350 which includes a non-linear transconductor. Details of the predistortion stage 320 will be described later in connection with FIG. 4.

The programmable filter 330 serves to filter a predistorted signal from the predistortion stage 320. The programmable filter 330 can select a desired frequency range and block undesired frequencies, thereby at least partially rejecting out-of-band noise. For example, the programmable filter 330 can limit the input signal to the bandwidth BW shown in FIG. 2. In various embodiments, the programmable filter 330 can act as a low-pass filter, a band-pass filter, or a high-pass filter. Increasing out-of-band noise rejection at this stage allows a reduction in input power while maintaining the desired SNR. The programmable filter 330 can be configured by the controller 340.

Filtering a predistorted signal can result in linearity degradation, and there can be a trade-off between filter bandwidth and distortion. Limiting the bandwidth of a predistorted signal increases the output distortion. As the bandwidth increases, so does spectral purity, which—depending on the characteristics of the non-linearity—may approach an asymptote when the filter's bandwidth is approximately 5 times the baseband bandwidth. The selection of filter bandwidth is discussed in more detail below with respect to FIGS. 6A and 6B.

The controller 340 can select a desired frequency range to be passed by programmable filter 330. In various embodiments, the controller 340 can be implemented as software/firmware and/or hardware. For example, firmware instructions can be stored in a tangible computer-readable medium and executed by a processor. The processor can be implemented by a general purpose processor, licensable core, or the like. In another example, the controller 340 can be implemented by control logic, which can reside in an application-specific integrated circuit, programmable gates, etc. The controller 340 can dynamically adjust the characteristics of programmable filter 330 in response to changing application demands such as, for example, to allow operation in a wide variety of bandwidths or to calibrate out process variations. In some embodiments in which the predistortion stage 320 is programmable, the controller 340 can also configure the distortion characteristics of the predistortion stage 320. In other embodiments, the programmable filter 330 can be replaced by a non-programmable filter, and the controller 340 can be omitted. In such embodiments, the characteristic of the non-programmable filter can be preset during the manufacturing of the transmitter.

The upconverter core 350 is configured to receive a pre-distorted and filtered signal outputted from the programmable filter 330. The upconverter core 350 can serve a similar function to, for example, the mixers 135, 155 as shown in FIG. 1. Specifically, the upconverter core 350 mixes the pre-distorted and filtered signal with the output of a local oscillator, for example, the ILO 130 or the QLO 150 shown in FIG. 1. For example, the upconverter core 350 can modulate a higher-frequency local oscillator signal with the output of the pre-distortion stage 320. In some embodiments, the output of the upconverter core 350 can drive another transmitter stage, such as the summing unit 160 as shown in FIG. 1.

Figure 4:
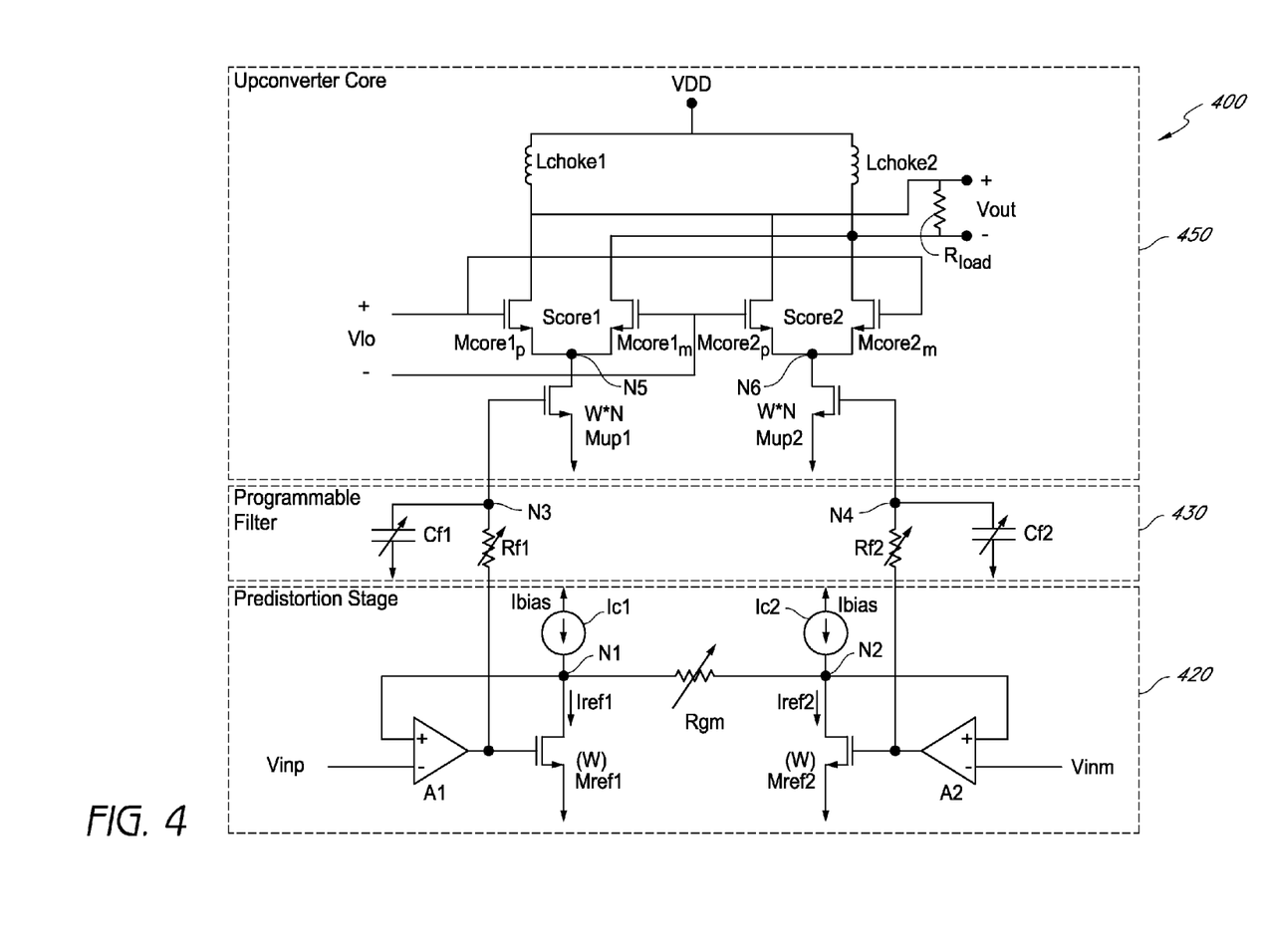
FIG. 4 is a circuit diagram of one embodiment of the portion of the transmission path of FIG. 3.

FIG. 4 is a circuit diagram of the portion 300 of FIG. 3 according to one embodiment. As described above, at least one of the mixers 135, 155 shown in FIG. 1 can be implemented using the portion 400 of FIG. 4. During operation, when upconverting a signal, spectral regrowth due to baseband signal-path distortion can degrade spectral purity. For example, without predistortion, a typical common-source transconductor will only produce adequate linearity when driven by a relatively small signal, which would degrade the signal to noise-plus-distortion ratio (SNDR). As shown in FIG. 4, the desired linearity is achieved by using a predistortion stage 405 prior in the signal path to an upconverter core 450. The predistortion stage 405 provides a distortion that is complementary to the distortion in the upconverter core 450.

In the illustrated embodiment, the portion 400 of the baseband path includes a predistortion stage 420, an upconverter core 450, and a programmable filter 430, which can generally correspond to the predistortion stage 320, the upconverter core 350, and programmable filter 330 as shown in FIG. 3, respectively.

The upconverter core 450 includes a transconductor stage and a double-balanced switching core. The transconductor stage includes transistors Mup1, Mup2 that can be arranged in a simple common-source transconductor which ordinarily has a relatively non-linear voltage-to-current transfer function, which is corrected by the predistortion stage 420. For power efficiency and to reduce noise, the bias current should be made as small as possible, preferably just incrementally larger than the signal current, which further increases the non-linearity of the upconverter core 450.

In the illustrated embodiment, the predistortion stage 420 includes a first operational amplifier (op-amp) A1, a second op-amp A2, a first reference transistor Mref1, a second reference transistor Mref2, a programmable resistor Rgm, a first current source Ic1, and a second current source Ic2.

The first op-amp A1 has an inverting input configured to receive a first voltage signal Vinp, a non-inverting input electrically coupled to a first node N1, and an output. The output of the first op-amp A1 can serve as a first output of the predistortion stage 420. The second op-amp A2 has an inverting input configured to receive a second voltage signal Vinm, a non-inverting input electrically coupled to a second node N2, and an output. The first and second voltage signals Vinp, Vinm together form a differential signal. The output of the second op-amp A2 can serve as a second output of the predistortion stage 420.

In the illustrated embodiment, the first reference transistor Mref1 can be an n-type field effect transistor (FET). The first reference transistor Mref1 has a source electrically coupled to a first voltage reference (for example, ground), a drain electrically coupled to the first node N1, and a gate electrically coupled to the output of the first op-amp A1.

In the illustrated embodiment, the second reference transistor Mref2 can be an n-type field-effect transistor. The second reference transistor Mref2 has a source electrically coupled to the first voltage reference (for example, ground), a drain electrically coupled to the second node N2, and a gate electrically coupled to the output of the second op-amp A2.

The first current source Ic1 includes an output that is electrically coupled to the first node N1. The first current source Ic1 serves to supply a first bias current Ibias1 to the first node N1.

The second current source Ic2 includes an output that is electrically coupled to the second node N2. The second current source Ic2 serves to supply a second bias current Ibias2 to the second node N2.

During operation of the predistortion stage shown in FIG. 4, a baseband input is provided to the nodes Vinp and Vinm and drives the inverting inputs of the op-amps A1, A2, with Vinp driving the first op-amp A1 and Vinm driving the second op-amp A2. The outputs of the op-amps A1, A2 drive the gates of the transistors Mref1, Mref2. The output of the first op-amp A1 drives the gate of the reference transistor Mref1 and the output of the second op-amp A2 drives the gate of reference transistor Mref2, so that the currents Iref1, Iref2 to flow through the transistors Mref1, Mref2, respectively. Currents flow from bias current sources Ibias1, Ibias2, which should have at least a current of Vin, max/Rgm. Additionally, the drains to the transistors Mref1, Mref2 feed back to the non-inverting inputs of the op-amps A1, A2, respectively. This feedback operation forces a copy of the baseband input (Vinp and Vinm) across the resistor Rgm. In other words, the circuit satisfies the expression: Iref1−Iref2=(Vinp−Vinm)/Rgm. Accordingly, the SNR, and power consumption can be tuned by adjusting the first bias current Ibias and a value of the resistor Rgm. In some embodiments, other elements in the predistortion stage can be programmable, allowing a reduction in power consumption in applications with less demanding noise requirements.

The non-linear transconductance in the upconverter core 450 is compensated by the predistortion stage 420. The predistortion stage 420 can include transistors Mref1, Mref2 that are scaled copies of the transistors Mup1, Mup2 of the upconverter core 450. The predistortion stage 420 can also include operational amplifiers A1, A2 with a high open-loop gain and negative feedback that forces a negligible difference between the individual differential inputs of the operational amplifiers A1 and A2.

As a result, a copy of the differential input voltage Vinp−Vinm is seen across the terminals of a resistor Rgm in the predistortion stage 420. The drain current of the transistor Mref1 is Ibias−(Vinp−Vinm)/Rgm, and the drain current of the transistor Mref2 is Ibias−(Vinm−Vinp)/Rgm. The differential current Iref1−Iref2 is 2*(Vinp−Vinm)/Rgm which is linearly proportional to the differential input voltage.

The feedback loop around the op-amp A1 and through the transistor Mref1 operates to cause the voltage at the node N1, which is the drain of the transistor Mref1, to be about equal to the voltage Vinp. Thus, the feedback loop linearizes the non-linearity in the I-V characteristic of the transistor Mref1. Since the gate-to-source voltage Vgs of the transistor Mref1 is equal to that of the transistor Mup1 in the upconverter core 450 and the transistor Mup1 is scaled to be N times larger than the transistor Mref1, the drain current of the transistor Mup1 is nominally equal to N times that of the transistor Mref1 and has a similar I-V characteristic. Therefore, the output of the op-amp A1 also corrects for the non-linear I-V characteristic of the transistor Mup1, even though Mup1 is open loop with respect to the feedback loop. Similarly, the feedback loop around the op-amp A2 linearizes the non-linearity in the I-V characteristic of the transistors Mref2, Mup2. Via the operation of the feedback loop, the predistortion stage 420 provides gate drive signals that correct the non-linearity in transconductance of the transistors Mref1, Mref2, Mup1, Mup2.

Referring still to FIG. 4, the programmable filter 430 includes a first programmable filter resistor Rf1, a second programmable filter resistor Rf2, a first programmable filter capacitor Cf1, and a second programmable filter capacitor Cf2. The programmable filter 430 serves to select a desired frequency range and block undesired frequencies, thereby at least partially rejecting out-of-band noise.

The first programmable filter resistor Rf1 includes a first end electrically coupled to the first output of the predistortion stage 420 and a second end forming a part of a third node N3. As described with respect to the predistortion stage 420, the first output of the predistortion stage 420 can be the output of the first op-amp A1. The third node N3 can be electrically coupled to a first filtered input of the upconverter core 450.

The first programmable filter resistor Rf1 serves to act as the resistance component of a first RC filter circuit formed in conjunction with the first programmable filter capacitor Cf1. In various embodiments, the first programmable filter resistor Rf1 can include a plurality of selectable resistors arranged in parallel and/or in series. For example, the first programmable filter resistor Rf1 can include an array of resistors interconnected with switches. The switches can include, for example, transistors or transmission gates. By opening and closing the switches, resistors can be combined in series and/or in parallel to adjust the resistance of the first programmable filter resistor Rf1.

The second programmable filter resistor Rf2 includes a second end electrically coupled to the second output of the predistortion stage 420 and a second end forming a part of a fourth node N4. As described with respect to the predistortion stage 420, the second output of the predistortion stage 420 can include the output of the second op-amp A2. Furthermore, the fourth node N4 can be electrically coupled to a second filtered input of the upconverter core 450.

The second programmable filter resistor Rf2 serves to act as the resistance component of a second RC filter circuit formed in conjunction with the second programmable filter capacitor Cf2. In alternative embodiments, the second programmable filter resistor Rf2 can include a plurality of selectable resistors arranged in parallel and/or in series. For example, the second programmable filter resistor Rf2 can include an array of resistors interconnected with switches. The switches can include, for example, transistors or transmission gates. By opening and closing the switches, resistors can be combined in series and/or in parallel to adjust the resistance of the second programmable filter resistor Rf2.

The first programmable filter capacitor Cf1 includes a first end electrically coupled to the first voltage reference (for example, ground) and a second end electrically coupled to the third node N3. As described with respect to the first programmable filter resistor Rf1, the third node N3 can be electrically coupled to a first filtered input of the upconverter core 450. The first programmable filter capacitor Cf1 serves to act as the capacitance component of the first RC filter circuit formed in conjunction with the first programmable filter resistor Rf1. In various embodiments, the first programmable filter capacitor Cf1 can include a plurality of selectable capacitors arranged in parallel and/or series. For example, the first programmable filter capacitor Cf1 can include an array of capacitors interconnected with switches. The switches can include, for example, transistors or transmission gates. By opening and closing the switches, capacitors can be combined in series and/or in parallel to adjust the capacitance of the first programmable filter capacitor Cf1.

The second programmable filter capacitor Cf2 includes a second end electrically coupled to the second voltage reference (for example, ground) and a second end electrically coupled to the fourth node N4. As described with respect to the second programmable filter resistor Rf2, the fourth node N4 can be electrically coupled to a second filtered input of the upconverter core 450. The second programmable filter capacitor Cf2 serves to act as the capacitance component of the second RC filter circuit formed in conjunction with the second programmable filter resistor R12. In various embodiments, the second programmable filter capacitor Cf1 can include a plurality of selectable capacitors arranged in parallel and/or series. For example, the second programmable filter capacitor Cf2 can include an array of capacitors interconnected with switches. The switches can include, for example, transistors or transmission gates. By opening and closing the switches, capacitors can be combined in series and/or in parallel to adjust the capacitance of the second programmable filter capacitor Cf2.

The first RC filter circuit formed by the first programmable filter resistor Rf1 and the first programmable filter capacitor Cf1 serves to filter the signal between the first output of the predistortion stage 420 and the first filtered input of the upconverter core 450. Similarly, the second RC filter circuit formed by the second programmable filter resistor Rf1 and the second programmable filter capacitor Cf2 serves to filter the signal between the second output of the predistortion stage 420 and the second filtered input of the upconverter core 450.

Each programmable element described with respect to the programmable filter 430 (for example, first and second programmable filter resistors Rf1, Rf2 and first and second programmable filter capacitors Cf1, Cf2) can be programmable by the controller 340 described earlier in connection with FIG. 3. Programmability can allow operation in a wide variety of bandwidths and allow calibration to normalize process variations. In alternative embodiments, the filter 430 is not programmable. In those embodiments wherein the filter 430 is not programmable, the respective capacitors and resistors are fixed or selected during test. A skilled artisan will appreciate that a number of techniques for creating programmable RC elements can be used to create a programmable filter, such as programmable filter 430.

Referring still to FIG. 4, the upconverter core 450 includes a first common-source transconductance amplifier Mup1, a second common-source transconductance amplifier Mup2, a first current-mode switching core Score1, a second current-mode switching core Score2, a first choke inductor Lchoke1, a second choke inductor Lchoke2, and a load resistor Rload. The upconverter core 450 serves to generate an upconverted output voltage Vout between a positive upconverted output terminal (Voutp) and a negative upconverted output terminal (Voutm).

In the illustrated embodiment, the first common-source transconductance amplifier Mup1 is an n-type FET having width W*N, where N is a scale factor. The first common-source transconductance amplifier Mup1 includes a source electrically coupled to the first voltage reference (for example, ground), a drain electrically coupled to a fifth node N5, and a gate electrically coupled to a first output of the programmable filter 430. The gate of the first common-source transconductance amplifier Mup1 can be referred to as the first filtered input of the upconverter core 450, and can be electrically coupled to the third node N3. The first common-source transconductance amplifier Mup1 can have poor linearity, which can be at least partially corrected by predistortion stage 420.

In the illustrated embodiment, the second common-source transconductance amplifier Mup2 is an n-type metal FET having width W*N, where N is a scale factor. The second common-source transconductance amplifier Mup2 includes a source electrically coupled to the second voltage reference (for example, ground), a drain electrically coupled to a sixth node N6, and a gate electrically coupled to a second output of the programmable filter 430. The gate of the second common-source transconductance amplifier Mup2 can be referred to as the second filtered input of the upconverter core 450, and can be electrically coupled to the fourth node N4. The second common-source transconductance amplifier Mup2 can have poor linearity, which can be at least partially corrected by predistortion stage 420.

The first current-mode switching core Score1 includes a first positive transistor Mcore1$p$ and a first negative transistor Mcore1$m$. The first current-mode switching core Score1 serves to modulate a local oscillator input Vlo, having positive (non-inverted) and negative (inverted) terminals, effectively by a filtered version of the input(Vinp-Vinm), as predistorted by the feedback circuit of the first op-amp A1 of the predistortion stage 420, filtered by the programmable filter 430, and transconducted by the transistor Mup1. Input voltage Vlo is received from a local oscillator, such as the ILO 130 or QLO 150, as shown in FIG. 1, or from a phase-shift circuit coupled to a local oscillator.

In the illustrated embodiment, the first positive transistor Mcore1$p$ is an n-type FET. The first positive transistor Mcore1$p$ has a source electrically coupled to the fifth node N5, a drain electrically coupled to the positive upconverted output terminal (Voutp), and a gate electrically coupled to the positive terminal of the local oscillator input Vlo (Vlop).

In the illustrated embodiment, the first negative transistor Mcore1$m$ is an n-type FET. The first negative transistor Mcore1$m$ has a source electrically coupled to the fifth node N5, a drain electrically coupled to the negative upconverted output terminal (Voutm), and a gate electrically coupled to the negative terminal of the local oscillator input. Vlo (Vlom).

The second current-mode switching core Score2 includes a second positive transistor Mcore2$p$ and a second negative transistor Mcore2$m$. The second current-mode switching core Score2 serves to modulate a local oscillator input Vlo, by the filtered input from the feedback circuit of the second op-amp A2 in the predistortion stage.

The second positive transistor Mcore2$p$ is an n-type metal oxide semiconductor (NMOS) transistor. The second positive transistor Mcore2$p$ has a source electrically coupled to the sixth node N6, a drain electrically coupled to the negative upconverted output terminal (Voutm), and a gate electrically coupled to the positive terminal of the local oscillator input Vlo (Vlop).

The second negative transistor Mcore2$m$ is an n-type FET transistor. The second negative transistor Mcore2$m$ has a source electrically coupled to the sixth node N6, a drain electrically coupled to the positive upconverted output terminal (Voutp), and a gate electrically coupled to the negative terminal of the local oscillator input Vlo (Vlom).

The first choke inductor Lchoke1 has a first end electrically coupled to a voltage reference Vdd, and a second end electrically coupled to the positive upconverted output terminal (Voutp). The first choke inductor Lchoke1 serves to act as the inductance component of a LR filter circuit formed in conjunction with the load resistor Rload.

The second choke inductor Lchoke2 has a first end electrically coupled to the voltage reference Vdd, and a second end electrically coupled to the negative upconverted output terminal (Voutm). The second choke inductor Lchoke2 serves to act as the inductance component of a LR filter circuit formed in conjunction with the load resistor Rload.

The load resistor Rload has a first end electrically coupled to the positive upconverted output terminal (Voutp), and a second end electrically coupled to the negative upconverted output terminal (Voutm).

In various embodiments, reference transistors in the predistortion stage are identical to, or scaled copies of, the common-source devices in the upconverter core. For example, as shown in FIG. 4, the first and second reference transistors Mref1, Mref2 have width W, while the transistors of the first and second common-source transconductance amplifiers Mup1, Mup2 have width W*N, where N is a scale factor. Because the gates of the first and second reference transistors Mref1, Mup1 are connected through the programmable filter 430, the current Iref1 through the first reference transistor Mref1 is accordingly mirrored to the transistor of the first common-source transconductance amplifier Mup1, notwithstanding the effects of filtering by the programmable filter 430. Similarly, as the gates of the first and second reference transistors Mref2, Mup2 are connected through the programmable filter 430, the current Iref2 through the second reference transistor Mref2 is accordingly mirrored to the transistor of the second common-source transconductance amplifier Mup2, notwithstanding the effects of filtering by the programmable filter 430. In some embodiments the upconverter core 450 can be segmented into a plurality of units to allow power control and power consumption that scales with output power. In one embodiment, the upconverter core 450 can be segmented into about 32 to about 96 units. In one embodiment, the upconverter core 450 can be segmented into about 64 units.

As described above, the predistortion stage 420 allows improved linearity with single-ended signal swings close to the range of saturation voltage. Conventionally, any noise introduced by the predistortion stage 420 is mirrored to the upconverter together with the desired predistorted signal. One potential way to reduce this mirrored noise is to use a relatively small value for the scale factor N between the first and second reference transistors Mref1, Mref2 and the transistors of the first and second common-source transconductance amplifier transistors Mup1, Mup2, respectively. Because a relatively small value for the scale factor N would lower the amplification between the predistortion stage 420 and the upconverter core 450, noise amplification would also be lower. However, that approach would require a higher power input into the predistortion stage 420, causing the power consumption of the predistortion stage 420 to be high. In the illustrated approach, described in connection with FIG. 4, a programmable filter 430 is used between the predistortion stage 420 and the upconverter core 450. The programmable filter 430 provides at least partial rejection of out-of-band noise which permits the power dissipation of the preceding stages to be reduced.

Figure 5:
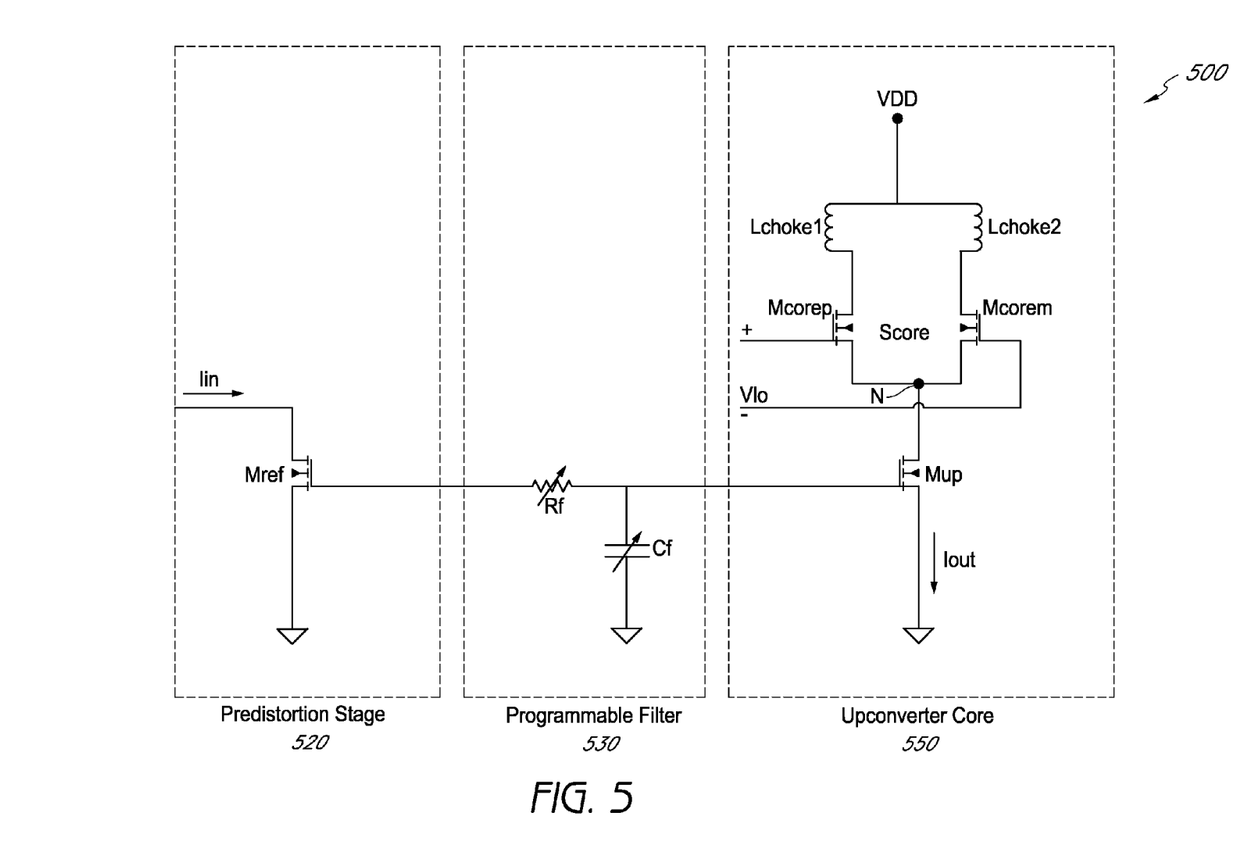
FIG. 5 is a circuit diagram of another embodiment of the portion of the transmission path of FIG. 3.

FIG. 5 is a circuit diagram of a baseband path portion 500 according to another embodiment. The baseband path portion 500 is configured to use a current as an input and an output, as opposed to the voltage-controlled input and current output described earlier in connection with FIG. 4. However, the portion 500 of the baseband path can be generally similar to the portion 300 of the baseband path, as shown in FIG. 3. Specifically, the portion 500 of the baseband path includes a predistortion stage 520, an upconverter core 550, and a programmable filter 530, which can generally correspond to the predistortion stage 320, the upconverter core 350, and the programmable filter 330 as shown in FIG. 3, respectively.

Like portion 300 of the baseband path, the portion 500 of the baseband path can be used in the baseband path of a transmitter such as the transmitter 100, shown in FIG. 1. For example, with respect to FIG. 1, the portion 500 of the baseband path can replace one or more of the LPF 125 and the in-phase mixer 135. Similarly, the portion 500 of the baseband path can replace one or more of the second low-pass filter 125 and quadrature-phase mixer 145. In alternative embodiments, a transmitter including the portion 500 of the baseband path does not have a separate amplification stage, such as the amplifier 170, as shown in FIG. 1. The portion 500 of the baseband path can be used in a number of different transmitter configurations, which need not include all components shown in FIG. 1, and can include additional components not shown.

In the illustrated embodiment, the predistortion stage 520 includes a transistor Mref. Both the gate and drain of Mref are connected to each other, an input node, and the programmable filter 530. The source is connected to ground, but can be connected to an alternative voltage reference. The upconverter core 550 includes a common-source transconductance amplifier Mup and a plurality of current-mode switching cores (not shown). In the illustrated embodiment, the transistors Mref and Mup can each be an n-type FET device. In general, the upconverter core 550 can be similar to the upconverter core 450 shown in FIG. 4. The upconverter core 550, however, does not use output terminals Vout. Instead, the output of the upconverter core 550 is the current Iout through the transistor Mup. Because transistors Mref and Mup are arranged in a filtered current-mirror configuration, the output Iout is an upconverted version of the input Iin.

Referring still to FIG. 5, a programmable filter 530 is placed in the signal path between the predistortion stage 520 and the upconverter core 550. In one embodiment, the programmable filter 530 includes a programmable capacitor Cf and a programmable resistor Rf. The programmable capacitor Cf and programmable resistor Rf form an RC circuit that filters the signal between transistor Mref and Mup. The programmable filter 530 can be generally similar to the programmable filter 430 described earlier in connection with FIG. 4. Similarly, the capacitor Cf and the resistor Rf can be generally similar to the capacitor Cf1 and the resistor Rf1, respectively, described earlier in connection with FIG. 4. Programmable elements can be selected by a controller, such as the controller 340 shown in FIG. 3. A number of techniques for creating programmable RC elements can be used to create a programmable filter, such as programmable filter 430.

The upconverter core 550 includes a common-source transconductance amplifier Mup, a current-mode switching core Score, a first choke inductor Lchoke1, and a second choke inductor Lchoke2. The upconverter core 550 serves to generate an upconverted output current Tout.

In the illustrated embodiment, the common-source transconductance amplifier Mup is an n-type FET having width W*N, where N is a scale factor. The common-source transconductance amplifier Mup1 includes a source electrically coupled to the first voltage reference (for example, ground), a drain electrically coupled to a node N, and a gate electrically coupled to a first output of the programmable filter 530. The gate of the common-source transconductance amplifier Mup can be referred to as the first filtered input of the upconverter core 550. The non-linearity of the common-source transconductance amplifier Mup can be at least partially corrected by the predistortion stage 520.

The current-mode switching core Score includes a positive transistor Mcorep and a negative transistor Mcorem. The current-mode switching core Score serves to modulate a local oscillator input Vlo, having positive and negative terminals, by the filtered input amplified by the common-source transconductance amplifier Mup. Input voltage Vlo is received from a local oscillator, such as the ILO 130 or the QLO 150, as shown in FIG. 1.

In the illustrated embodiment, the positive transistor Mcorep is an n-type FET. The positive transistor Mcorep has a source electrically coupled to the node N, a drain electrically coupled to a first end of the first choke inductor Lchoke1, and a gate electrically coupled to the positive terminal of the local oscillator input Vlo (Vlop).

In the illustrated embodiment, the negative transistor Mcorem is an n-type FET. The first negative transistor Mcorem has a source electrically coupled to the node N, a drain electrically coupled to a first end of the second choke inductor Lchoke2, and a gate electrically coupled to the negative terminal of the local oscillator input Vlo (Vlom).

The first choke inductor Lchoke1 has a first end electrically coupled to the drain of the positive transistor Mcorep, and a second end electrically coupled to a voltage reference Vdd.

The second choke inductor Lchoke2 has a first end electrically coupled to the drain of the negative transistor Mcorem, and a second end electrically coupled to a voltage reference Vdd.

In various embodiments, the reference transistor in the predistortion stage is identical to, or a scaled copy of, the common-source device in the upconverter core. For example, as shown in FIG. 5, the reference transistor Mref1 has width W, while the common-source transconductance amplifiers Mup has width W*N, where N is a scale factor. Because the gates of reference transistor Mref is connected through the programmable filter 530, the current through the reference transistor Mref is accordingly mirrored to the transistor of the common-source transconductance amplifier Mup, subject to changes introduced by the programmable filter 530. In some embodiments the upconverter core 550 can be segmented into a plurality of units to allow power control and power dissipation that scales with output power. In one embodiment, the upconverter core 550 can be segmented into about 32 to about 96 units. In one embodiment, the upconverter core 550 can be segmented into about 64 units.

Figure 6A:
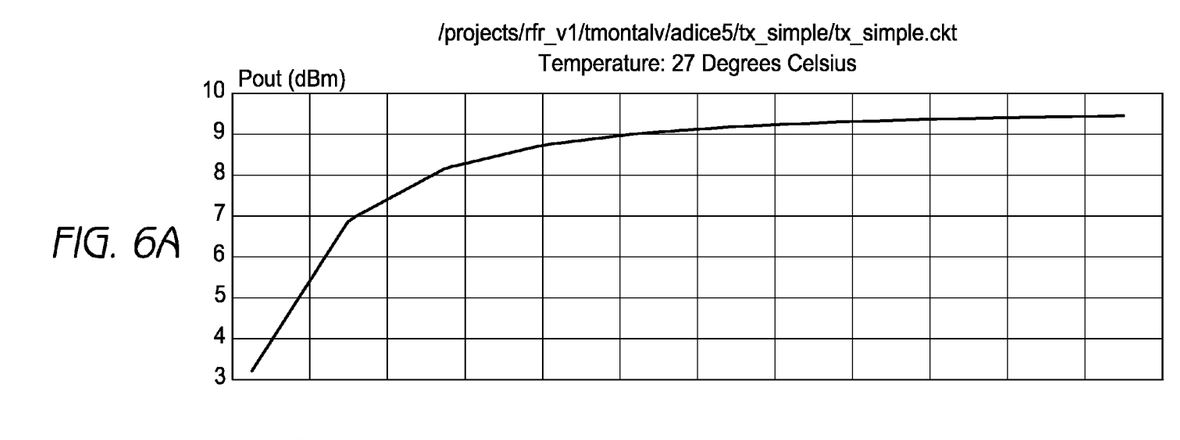
FIG. 6A is a graph illustrating a relationship between power output, distortion and filter bandwidth of a radio frequency transmitter according to one embodiment.
Figure 6B:
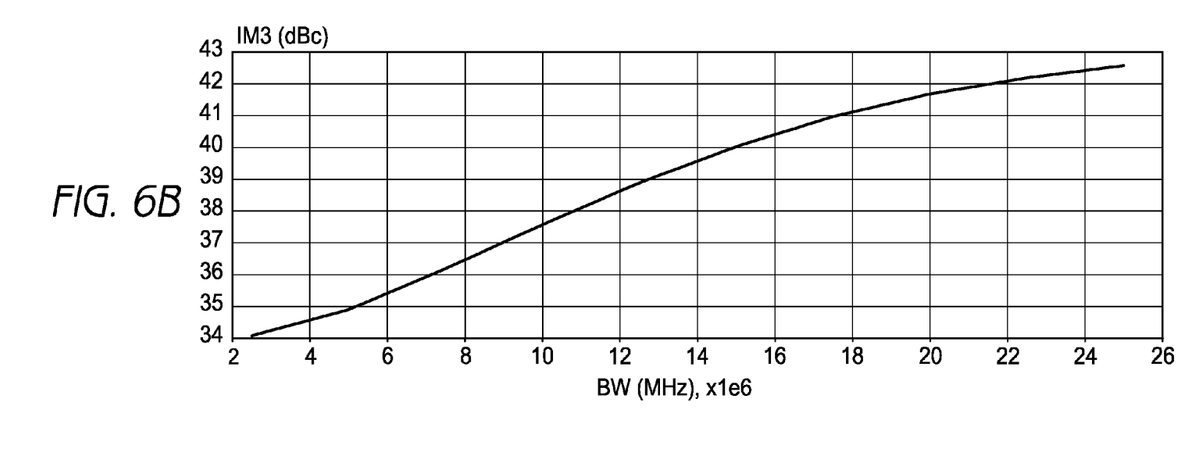
FIG. 6B is a graph illustrating a relationship between output spectral purity and filter bandwidth of a radio frequency transmitter according to one embodiment.

The act of predistorting a signal to compensate for non-linearity results in bandwidth expansion. Filtering a predistorted signal can therefore result in a degradation in linearity. FIGS. 6A and 6B are graphs illustrating power output (Pout) and inter-modulation distortion at the third harmonic (IM3) along the vertical axis with respect to filter bandwidth (BW) along the vertical axis, according to one embodiment. The inter-modulation distortion at the third harmonic is a measure of spectral purity. In the exemplary graph, inter-modulation distortion is computed as 20 log(Vdes/Vh3) where Vdes is the desired output voltage and Vh3 is the voltage at the third harmonic. Thus, inter-modulation distortion is a logarithmic measure of signal-to-distortion, with a lower value implying more distortion. FIGS. 6A and 6B are the result of a simulation in which the input to the filter was a full-scale 5 MHz tone. As shown, limiting the bandwidth of a predistorted signal increases the output distortion. As the bandwidth increases, so does spectral purity, which approaches an asymptote when the filter's bandwidth is approximately 5 times the baseband bandwidth (around 25 MHz in the illustrated example).

A transmitter's out-of-band noise requirement is typically determined by a wireless standard or by a governmental regulation. As shown in FIGS. 6A and 6B, spectral purity requirements are more difficult when specified at small frequency offsets from the carrier frequency. A survey of wireless standards suggests that one of the more difficult systems may be the frequency division duplex wireless systems deployed in the 700 MHz former TV bands in the US. This band is expected to use 5 MHz channels and a 30 MHz duplex spacing which is relatively small. With a 5 MHz RF bandwidth, the baseband bandwidth should be about 2.5 MHz. Therefore, the filter's corner frequency will be 12.5 MHz. At 30 MHz the filter will provide 8 dB (a factor of 2.6) of rejection of the predistortion stage's noise. The noise rejection of the can allow a reduction in the current consumption of the predistortion stage and the preceding stages by roughly a factor of 7.

In the embodiments described above, transmission systems were described in conjunction with particular embodiments. A skilled artisan will, however, appreciate that the principles and advantages of the embodiments can be used for any other systems, apparatus, or methods in which high spectral purity is desired. This includes, but is not limited to, any communication system with a predistortion stage and an upconverter core. For example, a skilled artisan will appreciate that there are a number of different ways to design predistortion circuits, upconverter cores, and programmable filters. The present disclosure is therefore not limited to the particular embodiments described. For example, while generally depicted with "n" type transistors, "p" type transistors can alternatively be used.

The foregoing description and claims may refer to elements or features as being "connected" or "coupled" together. As used herein, unless expressly stated otherwise, "connected" means that one element/feature is directly or indirectly connected to another element/feature, and not necessarily mechanically. Likewise, unless expressly stated otherwise, "coupled" means that one element/feature is directly or indirectly coupled to another element/feature, and not necessarily mechanically. Thus, although the various schematics shown in the Figures depict example arrangements of elements and components, additional intervening elements, devices, features, or components may be present in an actual embodiment (assuming that the functionality of the depicted circuits is not adversely affected).

Applications

Furthermore, the disclosed transmission methods, systems, and/or apparatus can be implemented into various electronic devices. Examples of the electronic devices can include, but are not limited to, consumer electronic products, parts of the consumer electronic products, electronic test equipments, etc. Examples of the electronic devices can also include memory chips, memory modules, circuits of optical networks or other communication networks, and disk driver circuits. The consumer electronic products can include, but are not limited to, wireless devices, a mobile phone, cellular base stations, a telephone, a television, a computer monitor, a computer, a hand-held computer, a personal digital assistant (PDA), a microwave, a refrigerator, a stereo system, a cassette recorder or player, a DVD player, a CD player, a VCR, an MP3 player, a radio, a camcorder, a camera, a digital camera, a portable memory chip, a washer, a dryer, a washer/dryer, a copier, a facsimile machine, a scanner, a multi functional peripheral device, a wrist watch, a clock, etc. Further, the electronic device can include unfinished products.

Although this invention has been described in terms of certain embodiments, other embodiments that are apparent to those of ordinary skill in the art, including embodiments that do not provide all of the features and advantages set forth herein, are also within the scope of this invention. Moreover, the various embodiments described above can be combined to provide further embodiments. In addition, certain features shown in the context of one embodiment can be incorporated into other embodiments as well. Accordingly, the scope of the invention is defined only by reference to the appended claims.

What is claimed is:

1. A method of processing a signal comprising:
predistorting an analog signal to generate a predistorted signal, wherein the predistorted signal at least partially compensates for non-linearity of a transistor;
filtering the predistorted signal to generate a filtered signal; and
upconverting the filtered signal, wherein the transistor to be compensated is used in upconverting,
wherein predistorting comprises operating a replica transistor in a feedback loop to generate a predistorted gate signal as the predistorted signal, and wherein upconverting comprises applying the filtered signal as a gate drive to a transistor that is a scaled version of the replica transistor.

2. An apparatus for processing a signal, the apparatus comprising:
means for predistorting a signal to generate a predistorted signal, wherein the predistorted signal at least partially compensates for non-linearity of a transistor;
means for filtering the predistorted signal to generate a filtered signal; and
means for upconverting the filtered signal, wherein the upconverting means comprises the transistor to be compensated,
wherein the means for predistorting comprises means for operating a replica transistor in a feedback loop to generate a predistorted gate signal as the predistorted signal, and wherein means for upconverting comprises means for applying the filtered signal as a gate drive to a transistor that is a scaled version of the replica transistor.

3. An apparatus comprising:
an upconverter;
an analog predistorter configured to receive an input signal and to generate a predistorted signal that at least partially corrects non-linearity of the upconverter, wherein the predistorted signal is applied as a gate input to a replica transistor of the analog predistorter; and
a filter disposed in a signal path between the predistorter and the upconverter, wherein the filter is configured to filter the predistorted signal to generate a filtered predistorted signal, wherein the filtered predistorted signal is provided as an input to the upconverter, wherein the filter is configured to reduce out-of-band noise generated by the predistorter.

4. The apparatus of claim 3, wherein upconverter comprises a scaled version of the replica transistor configured to receive the filtered signal as a gate drive.

5. The apparatus of claim 3, wherein the upconverter comprises a plurality of upconverter segments.

6. The apparatus of claim 3, wherein the filter comprises a programmable RC filter having one or more programmable resistors and one or more programmable capacitors.

7. The apparatus of claim 6, further comprising a controller configured to dynamically select filtering characteristics of the programmable RC filter based at least partially on a tradeoff between bandwidth and distortion.

8. The apparatus of claim 6, further comprising a controller configured to dynamically select filtering characteristics of the programmable RC filter based at least partially on a process variation.

9. The apparatus of claim 3, wherein the analog predistorter comprises the replica transistor in a feedback loop configured to generate the gate input as the predistorted signal.

10. The apparatus of claim 3, wherein the analog predistorter comprises:
a resistor having first and second terminals, wherein the first terminal is electrically connected to a first node and the second terminal is coupled to a second node;
a first bias current generator having an output electrically connected to the first node;
a first operational amplifier having an inverting input connected to a first baseband input terminal, a non-inverting input electrically connected to the first node, and an output associated with a first input of the upconverter;
a first transistor having a gate connected to the output of the first operational amplifier, a source connected to a voltage reference, and a drain connected to the first node;
a second bias current generator having an output electrically connected to the second node;
a second operational amplifier having an inverting input connected to a second baseband input terminal, a non-inverting input connected to the second node, and an output associated with a second input of the upconverter; and
a second transistor having a gate connected to the output of the second operational amplifier, a source connected to the voltage reference, and a drain connected to the second node.

11. The apparatus of claim 10, wherein the resistor comprises a programmable resistor.

12. The apparatus of claim 3, wherein the programmable filter comprises:
a first programmable capacitor having a first terminal connected to a voltage reference, and a second terminal connected to a first input of the upconverter;
a first programmable resistor having a first terminal connected to a first output of the predistorter, and a second terminal connected to the first input of the upconverter;
a second programmable capacitor having a first terminal connected to the voltage reference, and a second terminal connected to a second input of the upconverter; and
a second programmable resistor having a first terminal connected to a second output of the predistorter, and a second terminal connected to the second input of the upconverter.

13. The apparatus of claim 3, wherein the upconverter further comprises:
a first transistor having a gate coupled to a filtered version of a first output of the predistorter, a source connected to a second voltage reference, and a drain;
a second transistor having a gate electrically connected to a non-inverted oscillator signal, a source electrically connected to the drain of the first transistor, and a drain electrically connected to the first output node;
a third transistor having a gate electrically connected to an inverted oscillator signal, a source electrically connected to the drain of the first transistor, and a drain electrically connected to the second output node;
a fourth transistor having a gate coupled to a filtered version of a second output of the analog predistorter, a source connected to the second voltage reference, and a drain;
a fifth transistor having a gate connected to the non-inverted oscillator signal, a source electrically connected to the drain of the fourth transistor, and a drain electrically connected to the second output node; and
a sixth transistor having a gate electrically connected to the second oscillator input, a source electrically connected to the drain of the fourth transistor, and a drain electrically connected to the first output node.

14. A method of processing a signal comprising:
predistorting an analog signal to generate a predistorted signal, wherein the predistorted signal at least partially compensates for non-linearity of a transistor, wherein the predistorted signal is applied as a gate input to a replica transistor of a predistorter;
filtering the predistorted signal to generate a filtered signal; and
upconverting the filtered signal, wherein the transistor to be compensated is used in upconverting.

15. The method of claim 14, wherein predistorting comprises operating the replica transistor in a feedback loop to generate the gate input as the predistorted signal.

16. The method of claim 14, wherein upconverting comprises applying the filtered signal as a gate drive to a transistor that is a scaled version of the replica transistor.

17. The method of claim 14, wherein filtering is programmable during operation.

18. The method of claim 14, wherein filtering characteristics are programmable, further comprising adaptively adjusting filtering characteristics based at least partially on a trade-off between bandwidth and distortion.

19. The method of claim 14, further comprising dynamically selecting filtering characteristics based at least partially on a process variation.

20. An apparatus for processing a signal, the apparatus comprising:
means for predistorting a signal to generate a predistorted signal, wherein the predistorted signal at least partially compensates for non-linearity of a transistor, wherein the predistorted signal is applied as a gate input to a replica transistor of the means for predistorting;
means for filtering the predistorted signal to generate a filtered signal; and
means for upconverting the filtered signal, wherein the upconverting means comprises the transistor to be compensated.

21. The apparatus of claim 20, wherein the means for predistorting comprises means for operating the replica transistor in a feedback loop to generate the gate input as the predistorted signal.

22. The apparatus of claim 20, wherein means for upconverting comprises means for applying the filtered signal as a gate drive to a transistor that is a scaled version of the replica transistor.

23. The apparatus of claim 20, wherein the filtering means is programmable during operation.

24. The method of claim 20, wherein filtering characteristics are programmable, further comprising means for adaptively adjusting filtering characteristics based at least partially on a trade-off between bandwidth and distortion.

25. The method of claim 20, further comprising means for dynamically selecting filtering characteristics based at least partially on a process variation.

* * * * *

UNITED STATES PATENT AND TRADEMARK OFFICE
CERTIFICATE OF CORRECTION

PATENT NO. : 9,130,622 B2  
APPLICATION NO. : 12/848779  
DATED : September 8, 2015  
INVENTOR(S) : Antonio Montalvo It is certified that error appears in the above-identified patent and that said Letters Patent is hereby corrected as shown below:

In the Specification

In column 9 at line 10, Change "R12." to --Rf2.--.

In column 9 at line 11, Change "Cf1" to --Cf2--.

In column 9 at line 25, Change "Rf1" to --Rf2--.

In column 10 at line 38, Change "input." to --input--.

In column 12 at line 52, Change "Tout." to --Iout.--.

Signed and Sealed this  
Third Day of May, 2016

Michelle K. Lee  
*Director of the United States Patent and Trademark Office*